United States Patent [19]

Medeiors et al.

[11] Patent Number: 5,061,190
[45] Date of Patent: Oct. 29, 1991

[54] DOUBLE DENSITY BACKWARD AND FORWARD COMPATIBLE CARD EDGE CONNECTOR SYSTEM

[75] Inventors: James A. Medeiors; R. A. Beverly; Ty F. Safreno, all of San Luis Obispo, Calif.

[73] Assignee: Ziatech Corporation, San Luis Obispo, Calif.

[21] Appl. No.: 567,123

[22] Filed: Aug. 14, 1990

[51] Int. Cl.⁵ .............................................. H05K 1/00
[52] U.S. Cl. .................................... 439/60; 439/217; 174/261; 174/268
[58] Field of Search ........................ 439/59, 60, 61, 62, 439/629, 630, 631, 632, 637, 217; 174/250, 261, 268

[56] References Cited

U.S. PATENT DOCUMENTS 4,614,386  9/1986  Driller et al. ........................ 439/55
4,934,961  6/1990  Piorunneck ........................... 439/59

OTHER PUBLICATIONS

"Contractor Expansion of Electrical Connectors", *IBM Technial Disclosure Bullentin*, vol. 30, No. 8, Jan. 1988, pp. 217-219.

*Primary Examiner*—Leo P. Picard
*Assistant Examiner*—Trinidad Korka
*Attorney, Agent, or Firm*—Daniel C. McKown

[57] ABSTRACT

A printed circuit card and card edge connector for use with a 32-bit bus include respectively a pattern of conductive fingers and pins in the connector that render the card electrically compatible with existing 8-bit STD connectors and that render the card edge connector electrically compatible with existing 8-bit STD cards. the latter compatibility makes it possible to use in 32-bit systems any of the more than a thousand existing 8-bit circuits without modification; while the former compatibility makes available to 8-bit systems an easy path to growth and the expanded computational power of a 32-bit system.

2 Claims, 5 Drawing Sheets

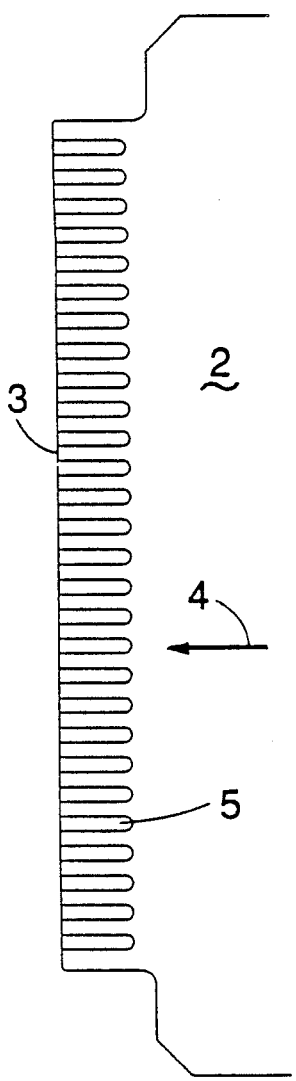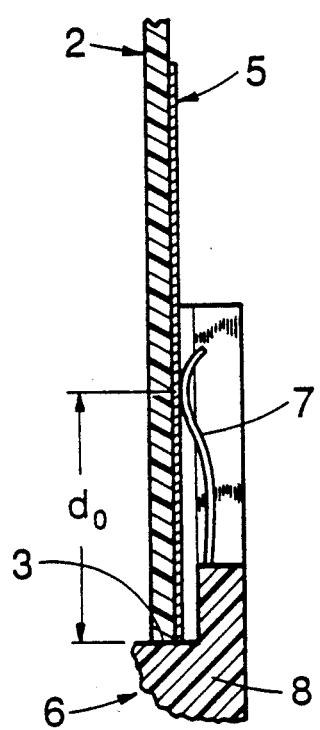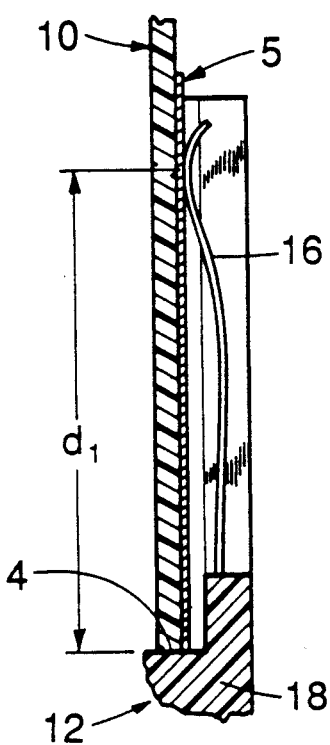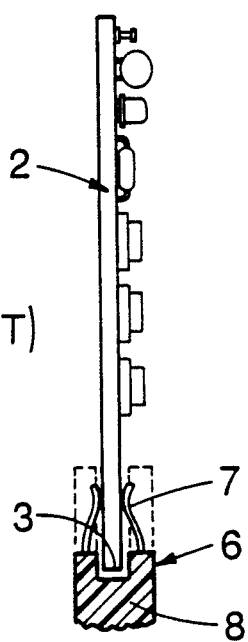

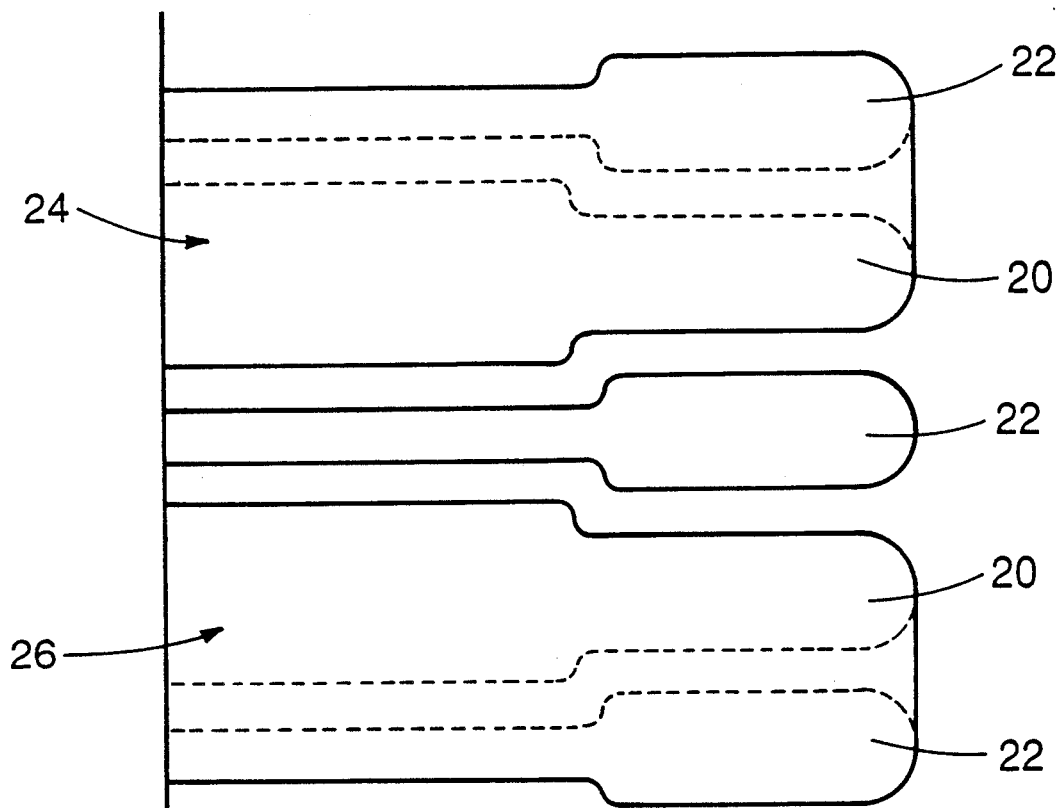
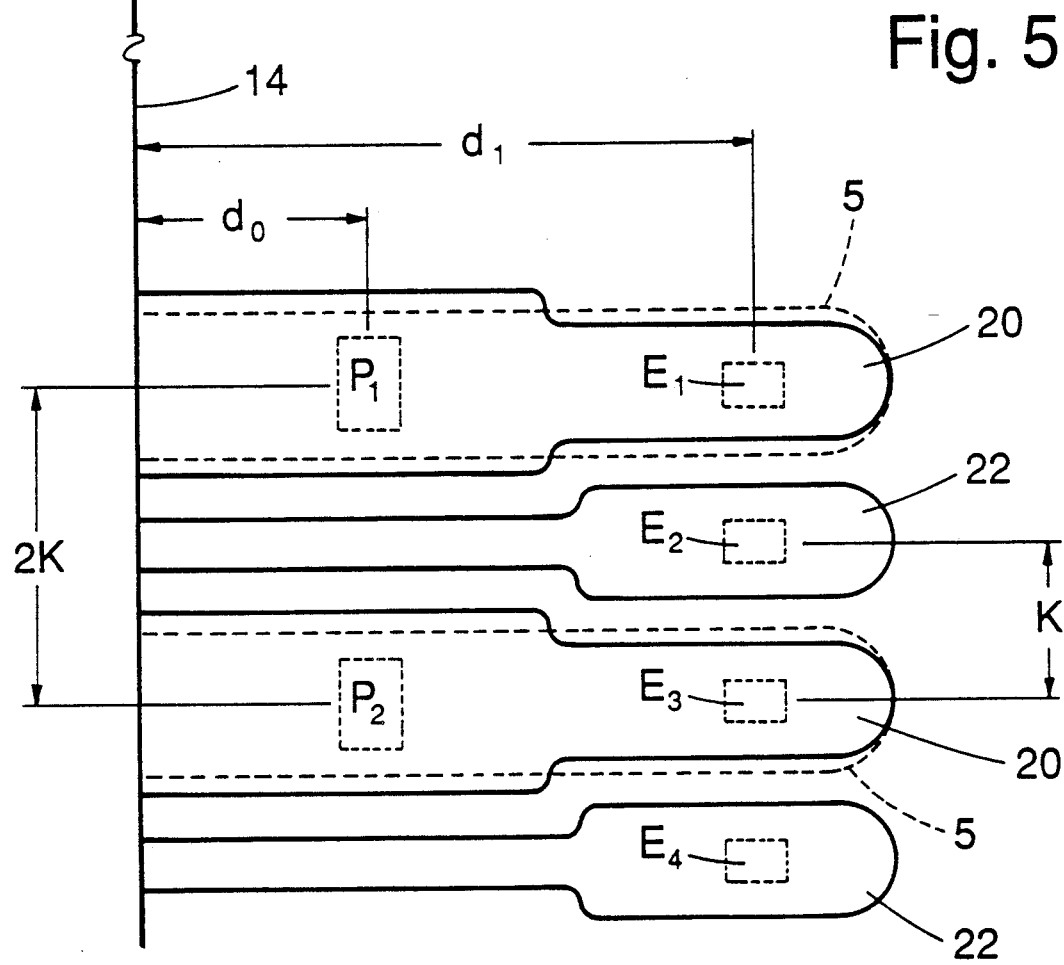
Fig. 5

DOUBLE DENSITY BACKWARD AND FORWARD COMPATIBLE CARD EDGE CONNECTOR SYSTEM

BACKGROUND OF THE INVENTION

1. Field of the Invention

The present invention is in the field of computer hardware and specifically relates to a novel card edge conductor pattern and card edge connector that permits 114 conductors to be connected to the card, instead of the conductors used in the earlier 8-bit STD card.

Cards of the new design can be used with connectors of the earlier type (although only 56 conductors will be connected to the card) and the new card edge connector will accept cards of the earlier standard design (although again only 56 conductors will be connected to the card).

By use of the new card edge conductor pattern and card edge connector it is possible to build computers which have the capability of operating with 32-bit words but which also are compatible with earlier 8 and 16-bit STD cards. Conversely, the new card edge conductor pattern and card edge connector can be used in 8 and 16-bit computers to provide for later upgrading to 32 bits.

2. The Prior Art

Brief acquaintance with the wiring diagrams of computers suggests that computers consist of processing circuits that are interconnected by a set of conductors. Some of the conductors are utilitarian and supply such housekeeping quantities as power and standard voltage levels including ground. Others of the conductors are bearers of reference quantities such as clock signals, timing signals, and signals that indicate the instantaneous state of the computer. Still others of the conductors carry signals representing data that is needed simultaneously in various parts of the computer. Together, these interconnecting conductors are called a bus.

Instead of being mere conductors, the processing circuits operate on some of the signals they receive from the bus to produce other signals which they apply to the bus. Traditionally, the processing circuits have been developed and produced separately on individual printed circuit boards, also called cards.

It is not difficult to visualize the bus as a sort of spinal cord of the computer and the processing circuits as the various bodily organs that are connected to it.

This imagery leads understandably to a computer architecture in which a stack of spaced and parallel cards are distributed along a one-dimensional, usually linear, bus. The whole computer fits neatly into a rectangular box.

Mechanically, one edge of each card fits into a socket in a card edge connector. The edge of the card includes a number of conductive fingers that are etched on the card and that extend perpendicular to the edge. Each conductive finger is contacted by a pin in the card edge connector, and is thereby connected electrically to a particular conductor in the bus. Normally the same pattern of conductive fingers is produced on both sides of the card adjacent the same edge, and the card edge connector includes a first set of pins that contacts the fingers on a first side of the card and a second set of pins that contacts the fingers on the second side of the card.

At present more than 1000 different processing circuits are available in card form from various manufacturers, and these all have identically the same standard finger pattern known as the 8-bit STD pattern, shown in FIG. 1. The corresponding bus is called the 8-bit STD Bus.

Introduced in 1978, the STD Bus is now the second most widely used industrial bus standard in the United States. An approved IEEE Standard, it provides a well-documented and supported modular approach for designing test and control systems. Rugged, easy to implement, and cost effective, STD Bus systems are being used at an increasing rate as this Standard enters its eleventh year.

However, a demand is developing for higher performance systems that are more computation-intensive. These systems require a bus that can accommodate 32-bit words rather than the 8-bit words used with the 8-bit STD Bus.

The present invention addresses the need for a 32-bit bus that retains the attractive characteristics of the 8-bit STD Bus and at the same time is backward-compatible with the more than 1000 8-bit STD cards currently available.

Thus, the present invention, in providing a growth path from 8-bit to 32-bit data does more than merely add more fingers to the cards and pins to the card edge connectors, although these are necessary. The significant accomplishment of the present invention is to provide a 32-bit Bus that is compatible with the more than 1000 8-bit STD Bus cards currently available. This permits users of the 32-bit bus of the present invention to capitalize on the enormous variety of cards available in the 8-bit STD Bus format while keeping open a growth option to 32-bit performance.

In U.S. Pat. No. 4,934,961 issued June 19, 1990 to Piorunneck, et al, there is described a bi-level connector for making mechanical and electrical contact between a mother printed circuit board and a daughter printed circuit board. The connector, as best seen in FIGS. 13 and 14 of the patent, uses alternating short and long contact pins which contact the daughter printed circuit board at different distances from its inserted edge. In contrast, in the present invention, the contact pins of the connector are identical. The connector of Piorunneck, et al. is described as having backward compatibility in the sense that their new connector will accommodate an older type of circuit board. However, their new type of circuit boards cannot be used in old type connectors; thus, unlike the present invention, the invention of Piorunneck, et. al. lacks forward compatibility. The patent includes a lengthy listing of the prior art.

SUMMARY OF THE INVENTION

The present invention includes a pattern of conductive fingers that make it possible to bring 114 conductors onto a printed circuit board (card) from a 32-bit bus. The pattern of conductive fingers permits the same card to be used with an 8-bit bus by inserting the edge of the card into an 8-bit edge connector.

The present invention also includes a card edge connector that has 114 pins for use with the aforementioned circuit board, but arranged in a manner which permits the large number of previously developed 8-bit STD circuit boards to be used where appropriate in a computer using a 32-bit bus.

In accordance with the present invention, a card edge connector is provided with two ranks of pins. The pins of the two ranks are interdigitated and electrically isolated from one another, but otherwise identical.

Similarly, in accordance with the present invention the insertable edge of the card is provided with two ranks of etched conductive fingers. On both the card and the card edge connector, the pitch of the conductive fingers and of the pins, respectively, is half the pitch used in the prior art 8-bit cards and connectors, so that in the cards and connector of the present invention one rank of conductive fingers and pins is connected to the same bus conductors as they would be in the absence of the second rank. Thus, the cards and connectors of the present invention include all of the capabilities of existing 8-bit hardware. The provision of the second rank of pins and card fingers doubles the number of pins and fingers thereby enabling use of the cards and connectors in computers having a 32-bit bus, in the same space.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

BRIEF DESCRIPTION OF THE DRAWINGS

FIG. 1 is a fractional plan view showing the pattern of conductive fingers adjacent the insertable edge of an 8-bit STD card of the prior art;

FIG. 2 is a fractional cross sectional side elevation view showing an 8-bit STD card of the prior art inserted in a card edge connector of the prior art;

FIG. 3 is a fractional cross sectional side elevation view showing in greater detail the 8-bit STD card of the prior art inserted in a card edge connector of the prior art;

FIG. 4 is a fractional cross sectional side elevation view showing the 32-bit card of the present invention inserted in the card edge connector of the present invention;

FIG. 5 is a diagram comparing the conductive finger pattern of the 32-bit card of the present invention (solid lines) with the conductive finger pattern of the 8-bit STD card of the prior art (dashed lines);

DETAILED DESCRIPTION OF THE PREFERRED EMBODIMENT

Figure 6:
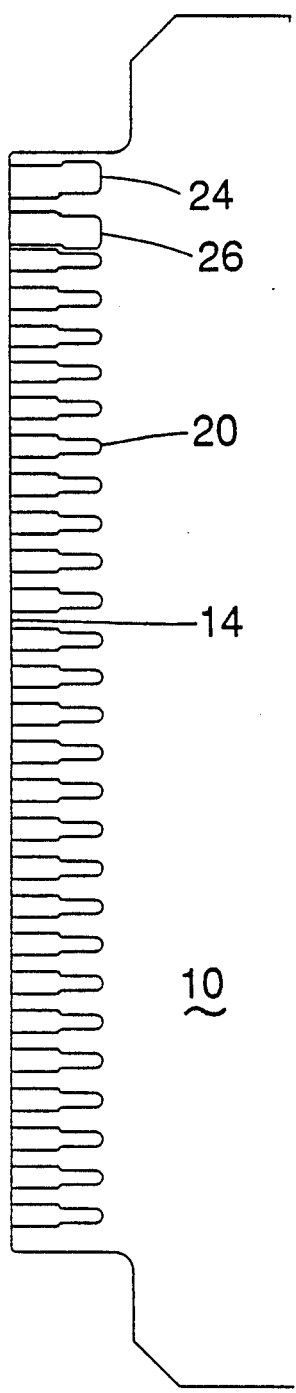
FIG. 6 is a fractional plan view showing a first rank of conductive fingers on the 32-bit card of the present invention.

A preferred embodiment of the present invention will be described in detail below with the help of the figures, in which the same reference numeral is used to denote the same part throughout.

FIG. 1 shows a face of an 8-bit STD card 2 of a type well known in the prior art. The success of the 8-bit STD card design is attested to by its widespread use throughout the computer industry and by the fact that more than 1,000 circuits are available commercially on such cards. In use, the edge 3 is inserted in the direction of the arrow 4 into an edge connector 6 as shown in FIG. 2. The edge 3 includes 28 conductive fingers, of which the conductive finger 5 is typical, juxtaposed along the edge 3 on both faces of the card.

FIG. 2 shows the 8-bit STD card 2 inserted into the 8-bit edge connector 6. The latter includes a base 8 and two rows of pins, of which the pin 7 is typical, which extend from the base 8 to make electrical contact with the conductive fingers 5.

Figure 9:
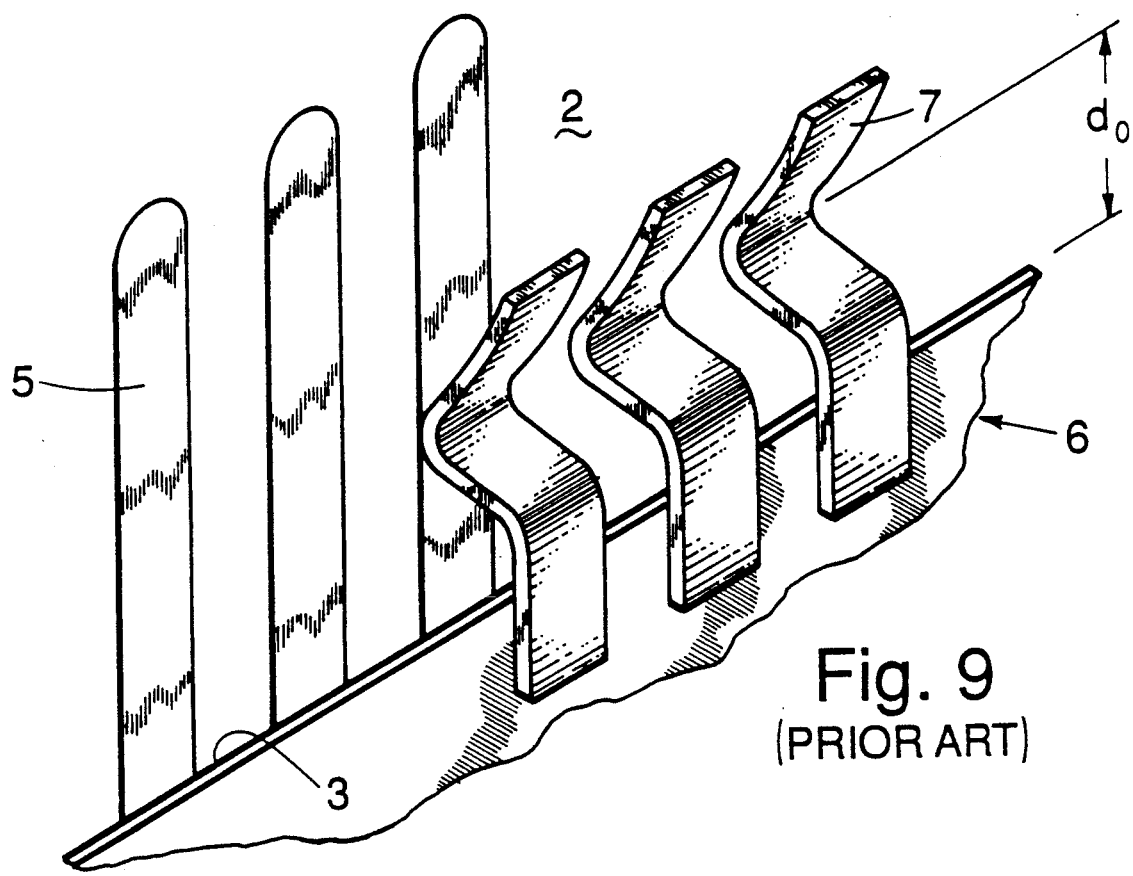
FIG. 9 is a diagrammatic perspective view showing an 8-bit STD card of the prior art inserted in a card edge connector of the prior art.

FIG. 3 is an enlarged detail of FIG. 2 and shows that the pin 7 makes contact with the conductive finger 5 on the card 2 a distance $d_0$ from the edge 3 when the card is fully inserted into the connector. The elements shown in FIG. 3 are shown in a perspective view in FIG. 9.

The 32-bit card 10 of the present invention has the same exterior dimensions as the 8-bit STD card of the prior art and plugs into the 32-bit card edge connector 12 of the present invention as shown in FIG. 4, in a manner similar to that in which the 8-bit STD card 2 of the prior art plugs into the 8-bit card edge connector 6 of the prior art. That is, the edge 14 of the card 10 extends into the base 18. Pins, of which the pin 16 is typical, extend from the base 18 and contact the conductive fingers 20 and 22 on the card 10 at a distance $d_1$ from the inserted edge 14. The assembly of FIG. 4 is shown in a perspective view in the diagram of FIG. 12.

FIG. 5 is a diagram showing on an enlarged scale the conductive fingers of the 32-bit card 10 adjacent its edge 14. In FIG. 5, the conductive fingers 5 of the 8-bit STD card of FIG. 1 are shown by dashed lines for comparison.

Figure 11:
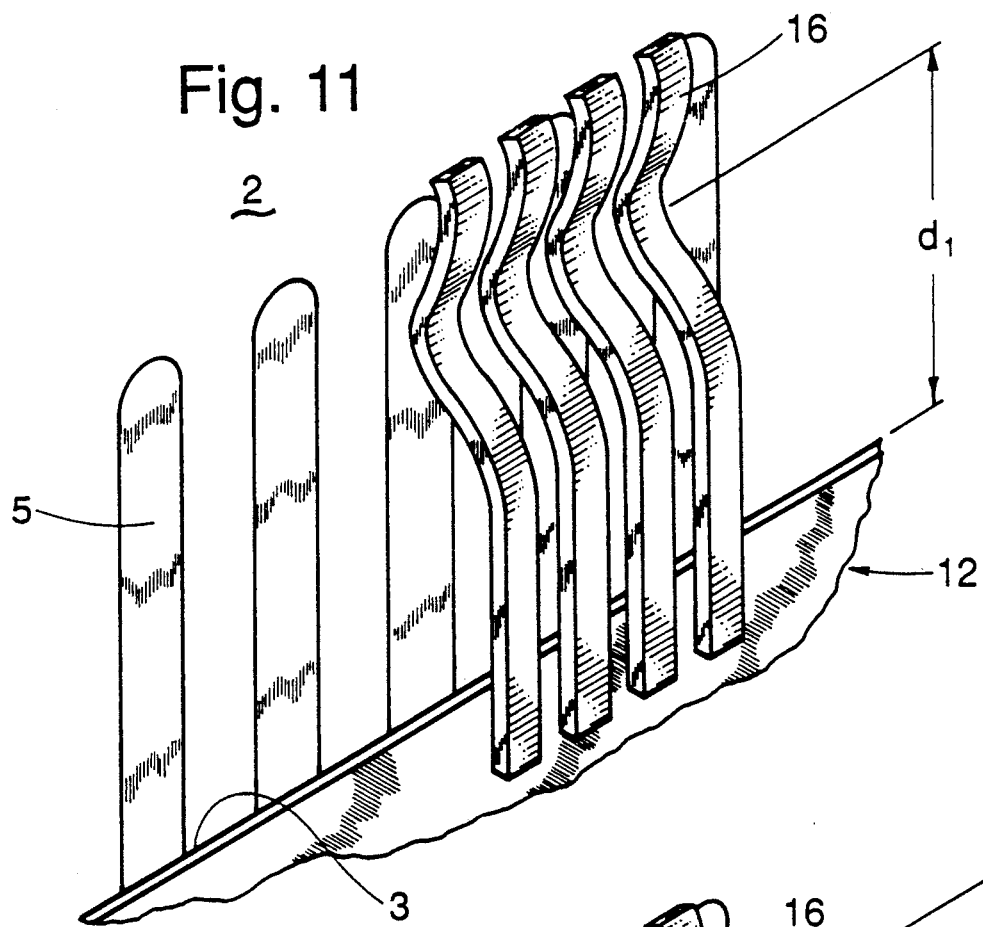
FIG. 11 is a diagrammatic perspective view showing an 8-bit STD card of the prior art inserted in a card edge connector of the present invention to illustrate its compatibility therewith; and, FIG. 12 is a diagrammatic perspective view showing the 32-bit card of the present invention inserted in a card edge connector of the present invention.

In FIG. 5, the contact areas of the pins 7 with the conductive fingers 5 of the 8-bit STD card are denoted by the letters $P_1$ and $P_2$. Likewise, the contact areas of the pins 16 of the 32-bit card edge connector 12 of the present invention on the conductive fingers of the 32-bit card 10 of the present invention are denoted by the letters $E_1$ through $E_4$. Note that the ample length of the conductive fingers 5 easily accommodates the greater length of the pins 16 of the 32-bit card edge connector of the present invention. This may be seen more clearly in the perspective view diagram of FIG. 11.

The conductive fingers 20 constitute a first set or rank of conductive fingers on the 32-bit card, and as seen in FIG. 5, the conductive fingers 20 are spaced at a pitch of 2K.

In accordance with the preferred embodiment of the present invention, a second set or rank of conductive fingers 22 is produced along the edge 14 of the 32-bit card 10. This second set of conductive fingers 22 includes the contact areas $E_2$ and $E_4$. The conductive fingers 22 are electrically isolated from each other as well as from the conductive fingers 20.

FIG. 6 shows the first set of conductive fingers 20 spaced along the edge 14 of the 32-bit card 10 of the present invention.

In addition to the first set of conductive fingers 20, a plus 5V conductive finger 24 and a GROUND conductive finger 26 are provided to receive power from the bus. Because of the possibility that greater power will be flowing through these fingers 24, 26, they are made wider to lower their resistance and to dissipate ohmic heat. They are formed by combining one conductive finger of the type 20 with one finger of the type 22.

Figure 7:
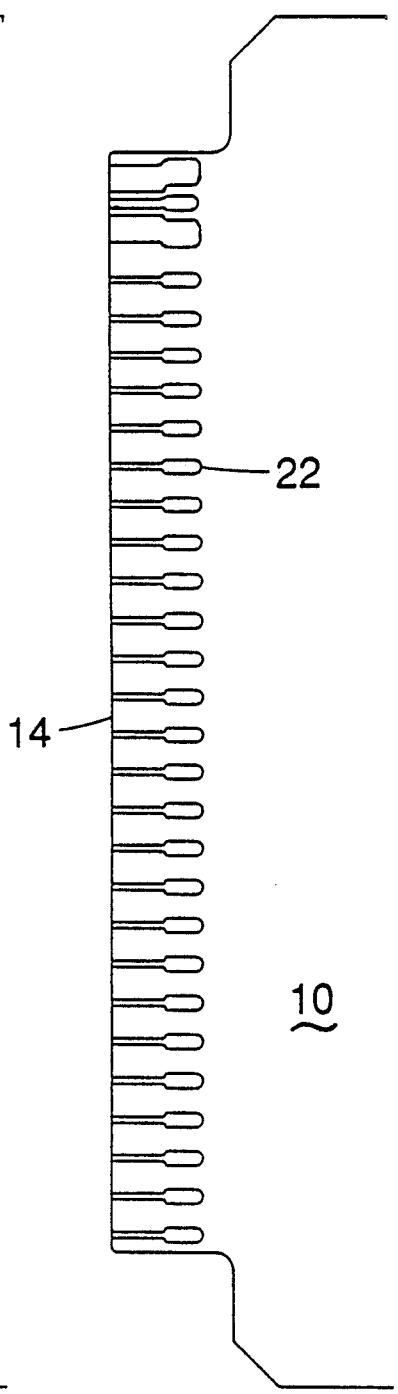
FIG. 7 is a fractional plan view showing a second rank of conductive fingers on the 32-bit card of the present invention.

FIG. 7 shows a second set of conductive fingers composed of the fingers 22. The pattern of conductive fingers shown in FIG. 6 and the pattern of conductive fingers shown in FIG. 7 would not likely be used separately, but they are shown separately for purposes of illustration.

Figure 8:
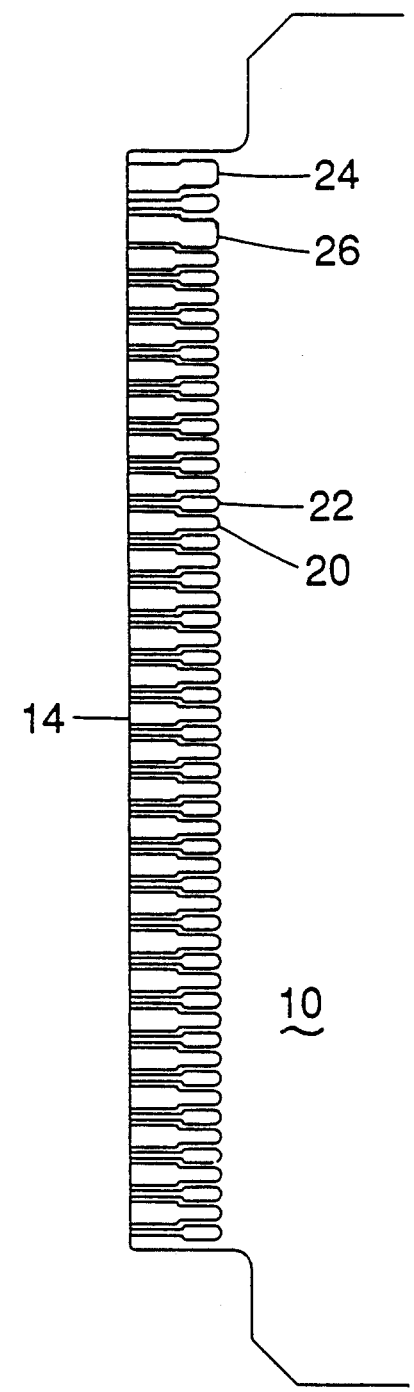
FIG. 8 is a fractional plan view showing the first and second ranks of conductive fingers of FIGS. 6 and 7, respectively, as combined on the 32-bit card of the present invention.

In accordance with the preferred embodiment of the present invention, the two sets of conductive fingers are combined on a card 10 as shown in FIG. 8. Thus, the present invention replaces the set of fingers 5 shown in FIG. 1 with the two sets of conductive fingers combined in the manner shown in FIG. 8. As pointed out above in connection with FIGS. 3 and 4, the present invention also necessitates increasing the length of the pins of the card edge connector and decreasing the width of the pins.

The card 2 of FIG. 1 has 28 fingers on each face along the same edge, making a total of 56 fingers per card. The pattern shown in FIG. 8 is duplicated on the other face of the card, so that the card includes 52 fingers like the finger 20, and 54 fingers like the finger 22 plus 4 power fingers 24 and 26 as illustrated in FIG. 5 consisting of 4 fingers 20 and 4 fingers 22 for a grand total of 114 fingers.

In the best mode of using the circuit card of the present invention, the same physical quantities that were assigned to the fingers 5 of the card 2 of the prior art are assigned in exactly the same order to the conductive fingers 20 of the first set. In this way, circuits that have been developed for use on the cards 2 of the prior art can be inserted into the card edge connector of the present invention, and the electrical signals will be delivered to the appropriate pin of the connector. That is to say, the 8-bit cards of the prior art are electrically compatible with the 32-bit card edge connector of the present invention. Electrical contact is made at the odd-numbered contact points $E_1$, $E_3$, $E_5$ ... on conductive fingers 5 as shown in FIG. 5. This is further illustrated in FIG. 11, wherein every other one of the pins 16 does not contact a conductive finger and is therefore unused. This feature is sometimes referred to as backward compatibility meaning that the card edge connector of the present invention is compatible with the prior art cards 2.

Figure 10:
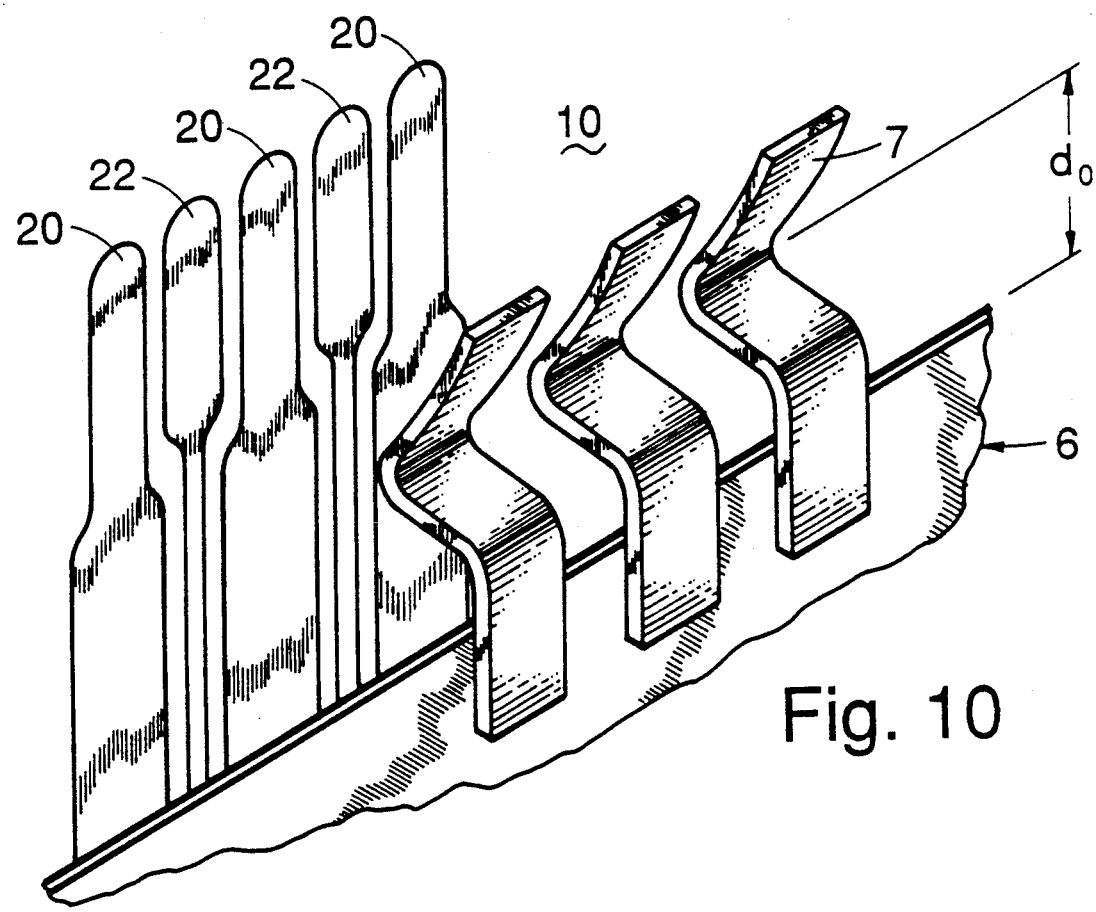
FIG. 10 is a diagrammatic perspective view showing the 32-bit card of the present invention inserted in a card edge connector of the prior art to illustrate its compatibility therewith.

This should be distinguished from what is sometimes called forward compatibility, illustrated in FIG. 10, in which the card edge connectors 6 of the prior art are electrically compatible with the cards 10 of the present invention. Electrical contact is made at contact point $P_i$ on conductive fingers 20. This arrangement provides for possible expansion of the capabilities of the cards by later inclusion of circuitry connected to the fingers 22.

Figure 12:
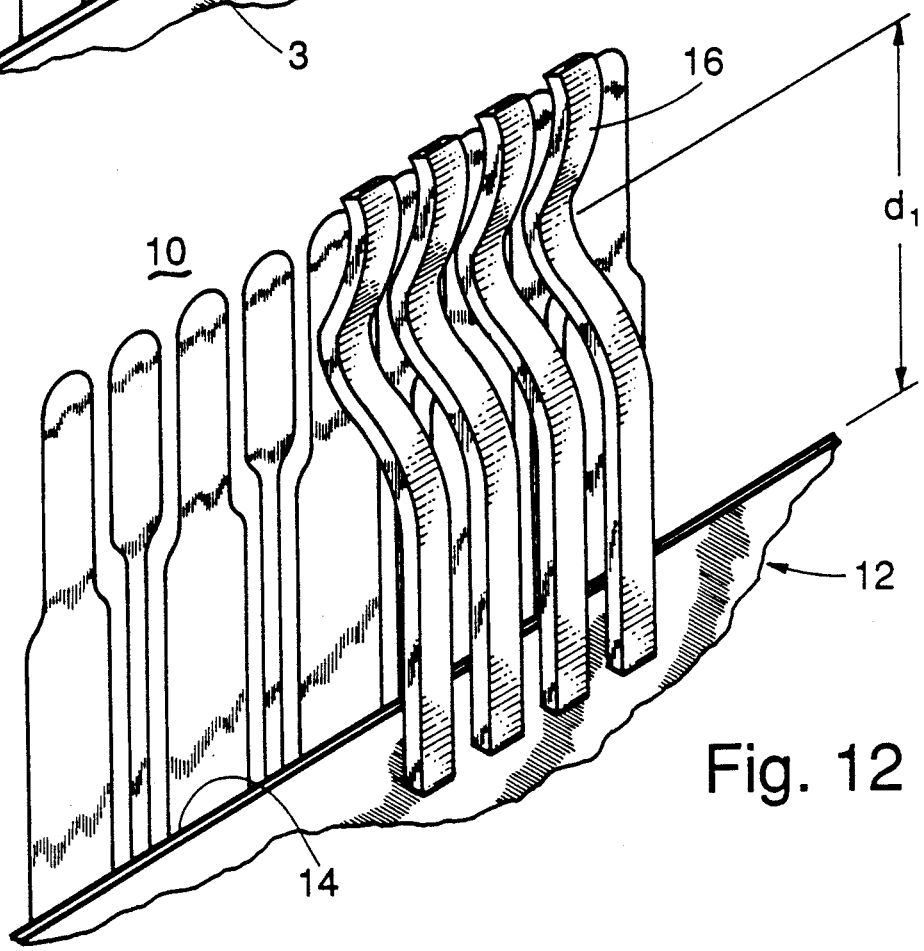

Maximum capability is achieved when the 32-bit cards of the present invention are used with the 32-card edge connector of the present invention, as illustrated in FIG. 12. This arrangement permits the full flexibility and power of 32-bit circuitry to be employed in a manner familiar to designers from their experience with the 8-bit technology.

Thus, it is seen that the present invention is more subtle than merely including more conductive fingers by making them smaller. While that is necessary, the present invention is configured in a manner that provides both forward and backward compatibility which is of enormous commercial and industrial importance.

The foregoing detailed description is illustrative of one embodiment of the invention, and it is to be understood that additional embodiments thereof will be obvious to those skilled in the art. The embodiments described herein together with those additional embodiments are considered to be within the scope of the invention.

What is claimed is:

1. A double density backward and forward compatible card edge connector system of the type in which a new type card (10) is usable in an old type connector (6) and in which a new type connector (12) is usable with an old type card (2), the old connector (6) including a plurality of equally spaced juxtaposed pins (7) that contact the old card (2) at a first straight row of spaced contact areas $P_i$ extending parallel to the inserted edge (3) of the old card (2) but spaced inward from the edge (3) a distance $d_0$, the contact areas $P_i$ of the first straight row (where $i = 1,2...N$) having a pitch 2K, said double density backward and forward compatible card edge connector system comprising in combination:

a new connector (12) having a plurality of identical equally spaced juxtaposed pins (16) that contact the old card (2) at a second straight row of spaced contact areas $E_j$, the second straight row parallel to the first straight row but spaced inward from the inserted edge a distance $d_1 > d_0$, the contact areas $E_j$ of the second straight row (where $j = 1,2...2N$) having a pitch K; and a new card (10) including
an edge (14) of suitable size and shape to permit it to be seated into the old connector (6) and into said new connector (12);
a first set (20) of conductive spaced parallel juxtaposed fingers extending partially across said new card (10) perpendicular to said edge (14) a distance greater than $d_1$ and covering the contact areas $P_i$ of the first straight row and covering the contact areas $E_{2i-1}$ of the second straight row; and,
a second set (22) of conductive spaced parallel juxtaposed fingers alternating with the fingers of said first set (20) but spaced from them, extending partially across said new card (10) perpendicular to said edge (14) a distance greater than $d_1$ and covering the contact areas $E_{2i}$ of said second straight row, whereby, when the new card (10) is seated in the old connector (6), the pins (7) of the old connector (6) make electrical contact with only said first set (20) of conductive spaced parallel juxtaposed fingers of said new card (10), and when said new card (10) is seated in said new connector (12), the pins (16) of said new connector (12) make electrical contact with both the first and second sets of conductive spaced parallel juxtaposed fingers of said new card (10).

2. A double density backward and forward compatible card edge connector system of the type in which a new type card (10) is usable in an old type connector (6) and in which a new type connector (12) is usable with an old type card (2), the old connector (6) including a plurality of equally spaced juxtaposed pins (7) that contact the old card (2) at a first straight row of spaced contact areas $P_i$ extending parallel to the inserted edge (3) of the old card (2) but spaced inward from the edge (3) a distance $d_0$, the contact areas $P_i$ of the first straight row (where $i=1,2...N$) having a pitch $2K$, said double density backward and forward compatible card edge connector system comprising in combination:

a new connector (12) having a plurality of identical equally spaced juxtaposed pins (16) that contact the old card (2) at a second straight row of spaced contact areas $E_j$, the second straight row parallel to the first straight row but spaced inward from the inserted edge a distance $d_1 > d_0$, the contact areas $E_j$ of the second straight row (where $j=1,2...2N$) having a pitch $K$; and a new card (10) including an edge (14) of suitable size and shape to permit it to be seated into the old connector (6) and into said new connector (12);

a first set (20) of conductive spaced parallel juxtaposed fingers extending partially across said new card (10) perpendicular to said edge (14) a distance greater than $d_1$ and covering the contact areas $P_i$ of the first straight row and covering the contact areas $E_{2i}$ of the second straight row; and, a second set (22) of conductive spaced parallel juxtaposed fingers alternating with the fingers of said first set (20) but spaced from them, extending partially across said new card (10) perpendicular to said edge (14) a distance greater than $d_1$ and covering the contact areas $E_{2i-1}$ of said second straight row, whereby, when the new card (10) is seated in the old connector (6), the pins (7) of the old connector (6) make electrical contact with only said first set (20) of conductive spaced parallel juxtaposed fingers of said new card (10), and when said new card (10) is seated in said new connector (12), the pins (16) of said new connector (12) make electrical contact with both the first and second sets of conductive spaced parallel juxtaposed fingers of said new card (10).

* * * * *